United States Patent
Monfarad et al.

(10) Patent No.: US 7,515,415 B2
(45) Date of Patent: Apr. 7, 2009

(54) EMBEDDED MICROCHANNEL COOLING PACKAGE FOR A CENTRAL PROCESSOR UNIT

(75) Inventors: Ali Heydari Monfarad, Albany, CA (US); Ji L. Yang, Monutain View, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 212 days.

(21) Appl. No.: 11/345,722

(22) Filed: Feb. 2, 2006

(65) Prior Publication Data

US 2007/0177351 A1    Aug. 2, 2007

(51) Int. Cl.
*H05K 7/20* (2006.01)
(52) U.S. Cl. .................. 361/699; 257/714; 165/80.3
(58) Field of Classification Search ............. 361/699, 361/700, 715, 704, 719; 257/712–715, E23.098; 165/80.3, 80.4, 104.33; 438/122
See application file for complete search history.

(56) References Cited

U.S. PATENT DOCUMENTS

| | | | | |
|---|---|---|---|---|
| 4,894,709 | A * | 1/1990 | Phillips et al. | 257/714 |
| 5,051,814 | A * | 9/1991 | Paal | 257/714 |
| 5,170,319 | A * | 12/1992 | Chao-Fan Chu et al. | 361/689 |
| 5,218,515 | A * | 6/1993 | Bernhardt | 361/689 |
| 5,870,823 | A * | 2/1999 | Bezama et al. | 29/848 |
| 5,901,037 | A * | 5/1999 | Hamilton et al. | 361/699 |
| 5,998,240 | A * | 12/1999 | Hamilton et al. | 438/122 |
| 6,459,581 | B1 * | 10/2002 | Newton et al. | 361/700 |
| 6,637,231 | B1 | 10/2003 | Monfarad | |
| 6,687,122 | B2 | 2/2004 | Monfarad | |
| 6,741,469 | B1 | 5/2004 | Monfarad | |
| 7,019,971 | B2 * | 3/2006 | Houle et al. | 361/699 |
| 7,032,392 | B2 * | 4/2006 | Koeneman et al. | 62/77 |
| 7,061,104 | B2 * | 6/2006 | Kenny et al. | 257/714 |
| 7,190,580 | B2 * | 3/2007 | Bezama et al. | 361/699 |
| 2006/0002087 | A1 * | 1/2006 | Bezama et al. | 361/699 |
| 2006/0108098 | A1 * | 5/2006 | Stevanovic et al. | 165/80.4 |

* cited by examiner

*Primary Examiner*—Boris L Chervinsky
*Assistant Examiner*—Courtney L Smith
(74) *Attorney, Agent, or Firm*—William J. Kubida; Libby A. Huskey; Marsh Fischmann & Breyfogle LLP

(57) ABSTRACT

An indirect cooling liquid embedded package design for use with a computer central processor unit is suitable for thermal management of high heat dissipation electronic components such as server processors. The indirect contact cooling liquid embedded packaged CPU has mechanical coupling and embedded plumbing that attaches to the board pumped liquid supply and indirect cooling of the heat-generating portion of the CPU with an embedded microchannel heat exchanger. The coolant package system for the CPU removes higher levels of heat indirectly from the core of the processors by convective cooling. Cooling liquid is introduced into the package of the server CPU by mechanically attaching the CPU to the board through a socket interconnect. Pins of the socket serves to provide electrical connection between the board and the CPU, while a few pins are designed for the purpose of inletting and outletting cooling liquid into and out of the CPU package.

20 Claims, 2 Drawing Sheets

EMBEDDED MICROCHANNEL COOLING PACKAGE FOR A CENTRAL PROCESSOR UNIT

BACKGROUND OF THE INVENTION

Removal of heat has become one of the most important and challenging issues facing computer system designers today. As the rate of power dissipation from electronic components such as high performance server processors and other such integrated circuits continues to increase, standard conduction and forced-air convection fan air cooling techniques no longer provide adequate cooling for such sophisticated electronic components. The reliability of the electronic system will suffer if high temperatures at hot spot locations are permitted to persist.

Conventional thermal control schemes such as air-cooling with fans, thermoelectric cooling, heat pipes, and passive vapor chambers have either reached their practical application limit or are soon to become impractical for high power electronic components such as computer server processors. When standard cooling methods are no longer adequate, computer manufacturers are forced to reduce the speed of their processors to match the capacity of existing cooling apparatus, accept lower component reliability due to inadequate cooling using existing cooling apparatus, or delay release of products until a reliable cooling apparatus for removal of heat from high heat dissipating processors are made available. Additionally, thermal management of high heat flux CPUs and other integrated circuit may require the use of bulky heat fan and heat sink assembly units, which have limited the ability of computer server manufacturers to adequately increase the capacity of their systems due to space limitations.

The computer industry is seriously considering utilizing active liquid cooling as an alternative to conventional passive air cooling for use in conjunction with high performance and high power processors. A number of attempts to incorporate liquid for cooling of high powered processors in the form of submerged liquid, liquid spray cooling, refrigeration cooling, and the like have been tried in the past, but none of the existing active liquid cooling solutions has been successfully utilized outside of their specific design conditions.

What is desired, therefore, is a practical and efficient packaging technique for cooling CPUs and other high heat-producing integrated circuits that overcomes the deficiencies of the prior art cooling techniques as set forth above.

SUMMARY OF THE INVENTION

An embedded microchannel indirect contact cooling liquid package design for use with a computer central processor unit is suitable for thermal management of high heat dissipation electronic components such as server processors as well as other integrated circuits. The embedded microchannel indirect contact cooling liquid package for a CPU includes proper mechanical coupling and embedded plumbing that attaches to a board pumped liquid supply. Cooling liquid flows into the microchannel piping in the CPU substrate. Cooling liquid continues to flow out of the microchannel piping into a silicon or metallic microchannel heat exchanger that is directly bonded to a silicon die for cooling of the heat-generating portion of the CPU. As a result, an embedded microchannel indirect contact cooling liquid package for a CPU can be utilized to remove substantially higher levels of heat from the core of the processors by forced convective liquid flow through the microchannel heat exchanger attached to the core of the CPU. Cooling liquid is introduced into the package of the server CPU by mechanically attaching the CPU to the board through a socket interconnect. Pins of the socket serves to provide electrical connection between the board and the CPU, while a few pins are designed for the purpose of providing an inlet and an outlet for cooling liquid into and out of the CPU package.

In an embodiment of the present invention, a PGA (pin grid array) flip-chip server CPU is attached to the cooling liquid in the system through mechanical connection of a specially designed socket unit. In addition to providing substantial heat removal ability, the cooling package of the present invention allows a designer to optimize the microchannel heat exchanger for efficient thermal management of the high heat portions of the processor. Other packaging systems than the flip-chip system can be used with the present invention such as a PGA socket, μPGA socket, PPGA socket, LGA socket or the like.

Additionally, the cooling package of the present invention removes the need for a fan and heat sink air cooling system, therefore reducing space traditionally occupied by such apparatus. Therefore, a much denser design of server boards with larger number of components per board and higher number of server processors can be achieved.

According to an embodiment of the present invention, flow of the cooling liquid in the microchannel heat exchanger provides a thermal path for heat removal from the heat generating portions of the silicon die and then heated liquid flows out of the CPU package for recirculation and heat removal. With no electrical insulation of the flow piping, dielectric cooling liquids that are thermally conductive, but electrically non-conductive are preferred. With proper electrical insulation of the flow piping, non-dielectric cooling liquids or even refrigerants may be introduced into the package for thermal management of the CPU. The liquid flow rate and choice of cooling liquid can be such as to prevent any massive boiling of the cooling liquid in the microchannel heat exchanger. Additionally, the cooling system pressure difference can be designed to make the entire cooling system orientation-independent for cooling purposes. A self-locking mechanism can prevent introduction of any foreign material or particles into the package, and any spillage of the cooling liquid in case of a rework process.

The cooling system of the present invention also uses the existing package-to-board practice of using sockets and therefore the entire cooling system is embedded into the processor-to-board assembly. From the end user's point of view, there is a tremendous amount of simplification of board design as the bulky fan and heat sink assemblies are removed. The replacement, according to the present invention, is a central liquid cooling system that can be made redundant to substantially prevent any reliability issues in the field.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein.

DETAILED DESCRIPTION

Figure 1:
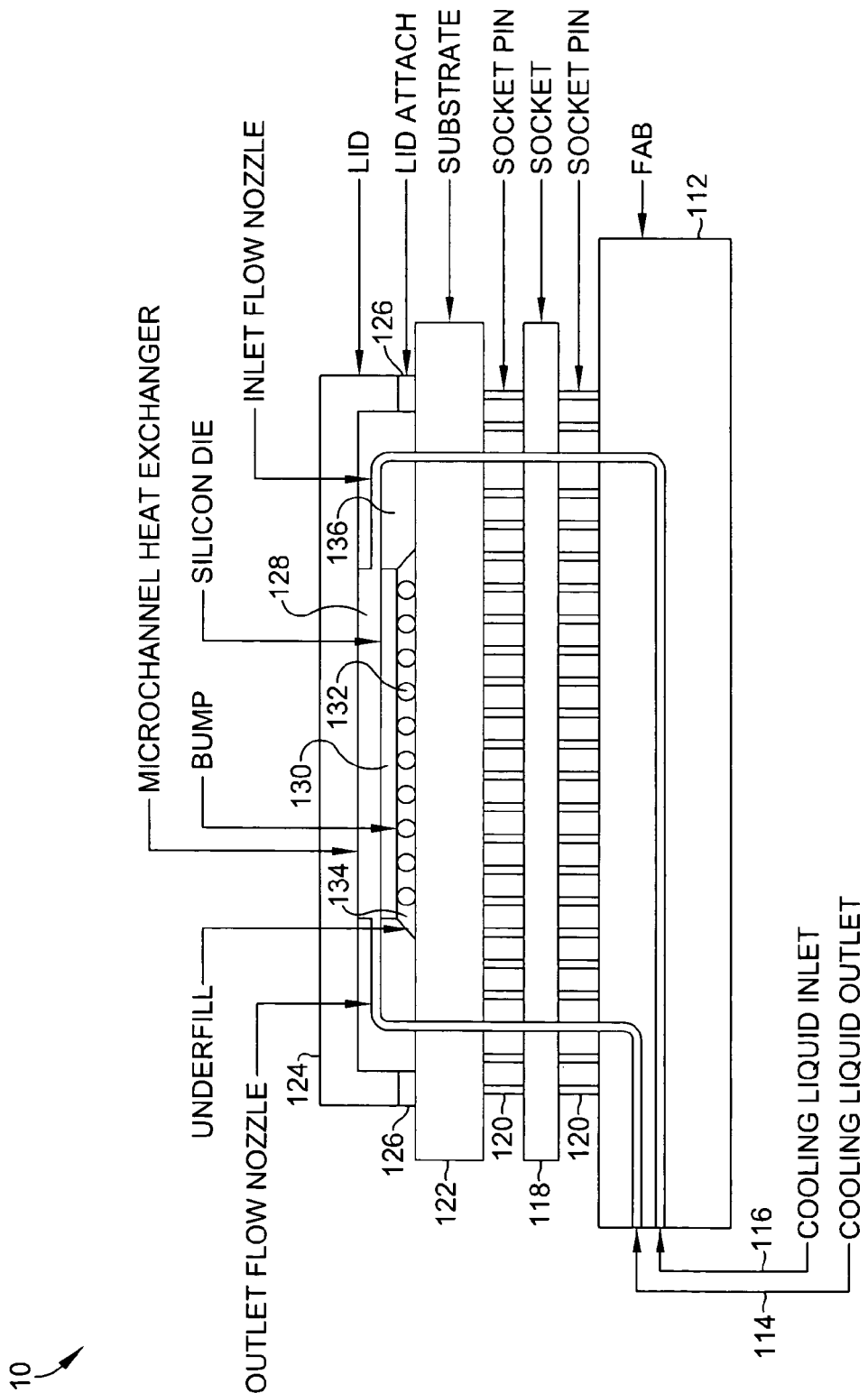
FIG. 1 is an expanded cross-sectional diagram of the embedded indirect microchannel cooling packaging system of an embodiment of the present invention.

Referring now to FIG. 1, a cooling package assembly 10 for an integrated circuit employing indirect embedded liquid cooling includes a board or "fab" 112 having a liquid coolant inlet 116 and a liquid coolant outlet 114, a socket 118 coupled to the board 112, and a package substrate 122 coupled to the socket 118. In the expanded cross-sectional view of FIG. 1, the board 112, the socket 118, and package substrate 122 are coupled together through socket pins 120. In actual usage, the board 112, the socket 118, and the package substrate 122 are in closer physical contact than is shown in FIG. 1. The expanded cross-sectional view of FIG. 1 is provided for ease of understanding the relationship of the individual components of the present invention only. A first microchannel allows liquid coolant to flow from the liquid coolant inlet 116 through the board 112, the socket 118, and the package substrate 122. A second microchannel allows liquid coolant to flow through the package substrate 122, the socket 118, and the board 112 to the liquid coolant outlet 114. An integrated circuit or silicon die 130 such as a CPU or other high heat-producing integrated circuit is attached to the top surface of the package substrate 122. A lid 124 is provided for surrounding the integrated circuit 130. A lid attachment 126 is provided for sealing the lid 124 to the substrate 122 to allow the liquid coolant to flow into the microchannel heat exchanger 128 that is physically attached to a top surface of the integrated circuit 130. The physical coupling of the microchannel heat exchanger 128 to the silicon die 130 allows for maximum heat transfer and maximum cooling of the silicon die 130.

In the indirect cooling package system of FIG. 1, the substrate 122 is preferably a ceramic molding material including one or more layers of metal interconnect circuits providing electrical connection between top and bottom metallic connection pads. The lateral dimensions of the substrate 122 are about $50 \times 50$ mm$^2$, and the substrate 122 is about 2 mm thick. Of course, these dimensions can be changed as is required to accommodate a specific application using a larger or smaller integrated circuit 130. Microchannels 114 and 116 have a diameter of about 0.5 mm. The diameter can be changed slightly, but should ideally conform to the constraints imposed by the dimensions of the socket pins 120 as shown in FIG. 1.

As previously stated, the integrated circuit 130 is typically a CPU or microprocessor, but any other high heat-producing integrated circuit 130 can be accommodated, such as a sophisticated digital signal processing integrated circuit, mixed analog/digital integrated circuit, or even a power or driver type of integrated circuit.

The indirect cooling package system 10 shown in FIG. 1 includes a number of conductive bumps 132 for attaching the integrated circuit 132 to the top surface of the package substrate 122. An underfill material 132 is used for conformally coating the conductive bumps. Non-conductive underfill materials suitable for this purpose are known to those skilled in the art.

The package system 10 shown in FIG. 1 includes a self-locking attachment mechanism 126 for providing a seal.

The liquid coolant used is ideally a fluorocarbon liquid coolant, which is thermally conductive, but electrically non-conductive. The recommended coolant fluid 128 is a fluorocarbon coolant fluid such as FC-72, FC-77, FC-86. If however, microchannels 114, 116, and the microchannel heat exchanger 128 are properly electrically insulated, any liquid coolant can be used. For example, cooling liquids can be water, water/glycol, or fluorocarbon cooling liquids such as FC-72, FC-77, FC-86. For aggressive cooling any refrigerant liquid such as R134a can be used.

The board or "fab" 112 can service one or more CPUs 130. The cooling liquid inlet/outlet 116/114 to the fab 112 can have a variety of forms, ranging from a liquid inlet from a local (to a computer server box) liquid distribution device to that coming from the data center chiller. Similarly, the cooling liquid outlet 112 can go to a local heat exchanger (for removal of heat collected by the cooling liquid to an area in the data center close to the server box) to the cooling tower of the data center, for removal of collected heat to the ambient. The board 112 shown in FIG. 1 is a conduit for carrying cooling liquid in and out of thermal contact with the CPU 130 for cooling purposes.

It is important to note, that while the flip-chip style of packaging according to an embodiment of the present invention is shown in FIG. 1, it is contemplated that the present invention can be easily applied to other known methods of packaging.

It is also important to note that the cooling liquid inlet/outlet 116/114 to the cavity 136 of the package system 10 are through tubes that are coupled to the substrate 122 of the package. The substrate 122 has internal liquid channels that lets the cooling liquid flow in/out of the package. Therefore, there is no need for any extra assembly, such as tubes for letting in/out the cooling liquid into the package.

Figure 2:
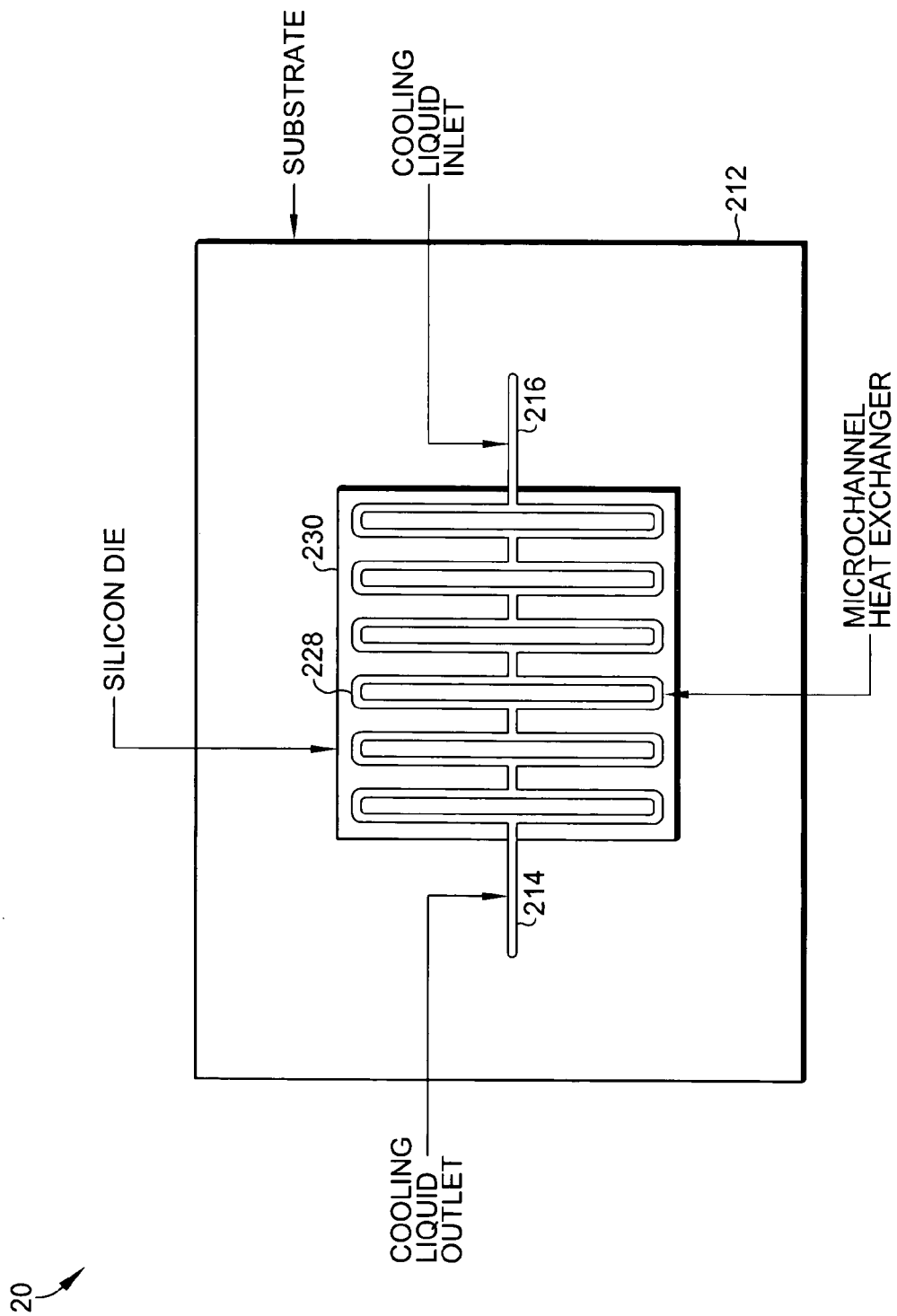
FIG. 2 is a plan view of the embedded indirect microchannel cooling packaging system shown in FIG. 1.

Referring now to FIG. 2, a plan view of the indirect contact cooling package system 20 of the present invention is shown in a plan view, with the top lid of the packing system 20 removed to show the silicon die 230 and the microchannel heat exchanger 228. Also shown in FIG. 2 are the package substrate 212, the cooling liquid inlet 216, and the cooling liquid outlet 214. The pattern of the microchannel heat exchanger 228 includes six repeated sections for uniformly transferring heat from silicon die 230 to the coolant liquid flowing through the microchannel heat exchanger 228. While the pattern shown in FIG. 2 is an effective pattern for efficient heat removal, many other such patterns can be used as long as all portions of the die footprint are serviced.

While there have been described above the principles of the present invention in conjunction with specific memory architectures and methods of operation, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

We claim:

1. A package for an integrated circuit employing indirect liquid cooling comprising:
   a substrate having a first microchannel for allowing liquid coolant to flow from a bottom surface of the substrate to a top surface of the substrate and a second microchannel for allowing liquid coolant to flow from the top surface of the substrate to the bottom surface of the substrate;
   an integrated circuit attached to the top surface of the substrate;
   a lid for surrounding the integrated circuit;
   a lid attachment for sealing the lid to the substrate; and
   a microchannel heat exchanger coupled to the first and second microchannels arranged between a top surface of the integrated circuit and the lid, wherein the top surface of the integrated circuit comprises one or more heat-producing portions of the integrated circuit and wherein the microchannel heat exchanger is directly coupled to the heat-producing portions.

2. The package of claim 1 wherein the substrate comprises ceramic molding material including at least one layer of metal interconnect circuits providing electrical connection between top and bottom metallic connection pads.

3. The package of claim 1 wherein the lateral dimensions of the substrate are about 50×50 mm².

4. The package of claim 1 wherein the substrate is about 2 mm thick.

5. The package of claim 1 wherein the microchannel has a diameter of about 0.5 mm.

6. The package of claim 1 wherein the integrated circuit comprises a microprocessor.

7. The package of claim 1 further comprising a plurality of conductive bumps for attaching the integrated circuit to the top surface of the substrate.

8. The package of claim 7 further comprising an underfill material for conformally coating the plurality of conductive bumps.

9. The package of claim 1 wherein the lid attachment comprises a self-locking attachment mechanism.

10. The package of claim 1 wherein the liquid coolant comprises water, water/glycol, a fluorocarbon liquid coolant, or a refrigerant.

11. A package assembly for an integrated circuit employing indirect liquid cooling comprising:
   a board having a liquid coolant inlet and a liquid coolant outlet;
   a socket coupled to the board via a first plurality of socket pins;
   a package substrate coupled to the socket via a second plurality of socket pins, wherein a first microchannel is arranged adjacent to the first and second pluralities of socket pins for allowing liquid coolant to flow from the liquid coolant inlet through the board, the socket, and the package substrate and a second microchannel is arranged adjacent to the first and second pluralities of socket pins for allowing liquid coolant to flow through the package substrate, the socket, and the board to the liquid coolant outlet;
   an integrated circuit attached to the top surface of the substrate;
   a lid for surrounding the integrated circuit;
   a lid attachment for sealing the lid to the substrate; and
   a microchannel heat exchanger coupled to the first and second microchannels placed on a top surface of the integrated circuit.

12. The package of claim 11 wherein the substrate comprises ceramic molding material including at least one layer of metal interconnect circuits providing electrical connection between top and bottom metallic connection pads.

13. The package of claim 11 wherein the lateral dimensions of the substrate are about 50×50 mm².

14. The package of claim 11 wherein the substrate is about 2 mm thick.

15. The package of claim 11 wherein the microchannel has a diameter of about 0.5 mm.

16. The package of claim 11 wherein the integrated circuit comprises a microprocessor.

17. The package of claim 11 further comprising a plurality of conductive bumps for attaching the integrated circuit to the top surface of the substrate.

18. The package of claim 17 further comprising an underfill material for conformally coating the plurality of conductive bumps.

19. The package of claim 11 wherein the lid attachment comprises a self-locking attachment mechanism.

20. A package assembly for an integrated circuit employing indirect liquid cooling, comprising:
   a board having a liquid coolant inlet and a liquid coolant outlet;
   a socket coupled to the board with a plurality of socket pins;
   a package substrate coupled to the socket via a plurality of socket pins wherein a first microchannel is arranged between two adjacent socket pins to allow liquid coolant to flow from the liquid coolant inlet through the board, the socket, and the package substrate and a second microchannel is arranged between two adjacent socket pins, said second microchannel for allowing liquid coolant to flow through the package substrate, the socket, and the board to the liquid coolant outlet;
   an integrated circuit attached to the top surface of the substrate;
   a lid for surrounding the integrated circuit;
   a lid attachment for sealing the lid to the substrate; and
   a microchannel heat exchanger coupled to the first and second microchannels placed on a top surface of the integrated circuit.

* * * * *